United States Patent [19]
Breckel et al.

[11] 4,311,924
[45] Jan. 19, 1982

[54] PULSE AMPLIFIER WITH ZERO CROSSING POINT DETECTION

[75] Inventors: Werner Breckel, Wendlingen; Bert Wurst, Möglingen, both of Fed. Rep. of Germany

[73] Assignee: Robert Bosch GmbH, Stuttgart, Fed. Rep. of Germany

[21] Appl. No.: 48,186

[22] Filed: Jun. 13, 1979

[30] Foreign Application Priority Data

Jun. 24, 1978 [DE] Fed. Rep. of Germany ....... 2827868

[51] Int. Cl.³ ............................................. H03K 5/153
[52] U.S. Cl. .................................... 307/354; 307/290; 307/359; 328/150
[58] Field of Search ............... 307/290, 354, 358, 359, 307/360, 252 UA; 328/150

[56] References Cited
FOREIGN PATENT DOCUMENTS 1406865 9/1975 United Kingdom ................ 307/354

Primary Examiner—John Zazworsky
Attorney, Agent, or Firm—Frishauf, Holtz, Goodman & Woodward

[57] ABSTRACT

In order to generate a signal having a well-defined feature which exactly coincides with the zero-crossing point of an input signal, for example in order to define the top dead center position of the crankshaft of an engine for the purpose of valve and ignition timing, the invention provides a circuit which is prepared by the passage of the first half of an input signal across a predetermined threshold. When the first threshold is exceeded, the circuit opens a switch which connects a source of reference potential, equal to the zero crossing point of the input signal, to the threshold switch, to represent a second threshold. As the input signal crosses that second threshold level, which constitutes the zero crossing point, the threshold switch closes, thereby generating the trailing edge of the output signal which constitutes a signal feature coincident with the zero crossing point and hence with a fixed angular position of the rotating shaft. As the zero crossing point is passed, the first threshold level is reestablished. The occurrence of the trailing feature of the output signal is in a constant phase relationship to the input signal and does not depend on the amplitude, frequency or duration of the input signal.

6 Claims, 3 Drawing Figures

PULSE AMPLIFIER WITH ZERO CROSSING POINT DETECTION

FIELD OF THE INVENTION

The invention relates to pulse amplification, especially to the amplification of trigger pulses generated by inductive transducers. More particularly, the invention relates to the amplification of pulses from transducers associated with rotary parts of internal combustion engines for the adjustment of valve timing, ignition timing, and the like. In particular, it is the purpose of the pulse amplifier to generate output signals which have a fixed phase relationship to the zero crossing point of the transducer signal and thus a fixed phase relationship to the angle of a rotating shaft of the engine.

BACKGROUND AND PRIOR ART

A known trigger pulse amplifier has a switching circuit with a reference value such that the switching threshold is triggered by the second, i.e., trailing, half wave of the input signal. Accordingly, the leading edge of the output signal occurs only sometime after the occurrence of the zero crossing point of the input signal. This delay depends on both the amplitude as well as the duration of the input signal and may vary in relatively wide domains, in particular if the input signal is derived from the rotational speed of a crankshaft. It is known to attempt compensation of these fluctuations by shifting the threshold of the switch but this compensation is found to be insufficient to hold the leading edge of the output signal within very narrow limits with respect to the zero crossing point of the input signal. Such narrow limits are required however in order to perform exact measurements. It is found that the duration of the output signal is substantially proportional to the duration of the input signal so that the position of the trailing edge of the output signal will depend, for example, on the frequency of the input signals, i.e., the rotational speed of the generating shaft. Accordingly, the occurrence of the trailing edge of the output signal is not suitable for determining the exact angular position of the rotating shaft.

OBJECT AND SUMMARY OF THE INVENTION

It is a principal object of the present invention to provide a trigger pulse amplifier which generates an output pulse that has a well-defined trailing edge which substantially coincides with the zero crossing point of the input signal independently of the amplitude or duration of the input signal. Another object of the invention is to provide a trigger pulse amplifier requiring only a relatively small number of circuit elements and thus not incurring any substantial additional expense.

Briefly, the invention provides a trigger pulse amplifier in which a switching stage is adjusted to a first threshold which is exceeded by the first half-wave of the input signal, thereby actuating a switch whose state of conduction is altered and causes a shift of the threshold of the circuit to a value which substantially equals the potential of the zero crossing point of the input signal.

If necessary, the trailing edge of the output circuit may be inverted so that it can be adapted readily to subsequent processor circuitry. In a preferred embodiment of the invention, the switch includes a single transistor which applies a reference voltage to the point at which the threshold is determined.

Further features and advantages of the invention will emerge from a description of the preferred exemplary embodiment which relates to the drawing.

DESCRIPTION OF THE PREFERRED EMBODIMENT

Figure 1:
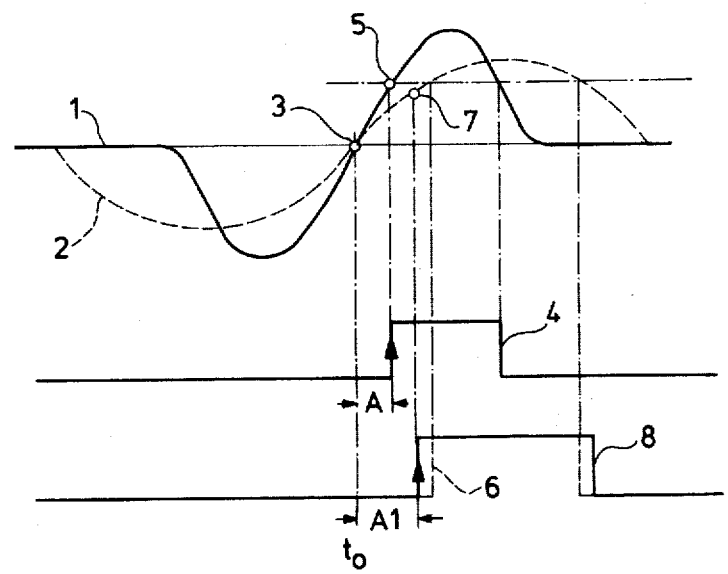
FIG. 1 is a diagram illustrating the function and characteristics of a known trigger pulse amplifier.

In engine test stands and engine diagnostic equipment, an inductive transducer is associated with a rotating part of the engine, for example the crankshaft, in order to provide a signal related to the angle of rotation or shaft position of the rotating part. A typical signal of this type is illustrated in FIG. 1, for example as the curve 1, which is seen to consist of a substantially sinusoidal pulse having a leading half-wave and a trailing half-wave of opposite polarity. The duration, frequency and amplitude of this signal all depend on the shaft speed. The transducer normally includes a pin or the like attached to the rotating shaft which passes a stationary sensing coil and induces therein the signals described by the curves 1 and 2. The curve 2, shown dashed, represents the signal obtained for a relatively slow speed of shaft rotation (rpm). The exact reference position of the shaft is defined as the zero crossing point 3 of these signals and this point is of great significance for the measurement, for example, of the ignition angle and timing. In order to detect these zero crossing points, a trigger pulse amplifier includes a switching stage which responds to a given amplitude of the input signal. The threshold of this amplifier must be high enough so as to prevent a response to spurious signals. In general, the pulse amplifier generates a signal for a period of time equal to the time that the input signal exceeds the threshold. This is illustrated in FIG. 1 in that the output pulse 4 is generated during the time in which the input signal 1 exceeds the threshold 5, and the amplifier generates the output signal 6 during the time in which the input pulse 2 exceeds the same threshold 5. From a comparison of the upper, and lower timing graphs, it will be observed that the leading edges of the pulses 4 and 6 are shifted with respect to the zero crossing points $t_0$ and that the amount of shift is different for the pulses 4 and 6, respectively. The aforementioned known trigger pulse amplifier includes a provision for attempting a compensation of the phase shaft by slightly lowering the threshold from a level 5 to a level 7 for signals of lower frequency, thereby actually producing an output signal 8 rather than an output signal 6. However, this compensation is seen to be insufficient to reduce the phase shift difference to zero as will be appreciated by comparison of the distances A and A1 which refer to the time of occurrence of the leading edge of the output pulses with respect to the zero crossing point $t_0$. Accordingly, the exact occurrence of the zero crossing point is not defined in the apparatus of the prior art and thus an exact determination of the shaft position is also made impossible.

Figure 2:
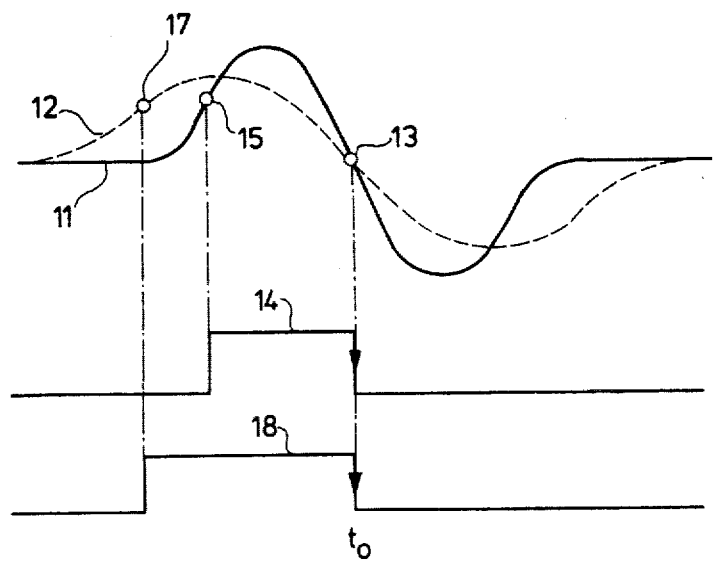
FIG. 2 is a diagram illustrating the function of the trigger pulse amplifier according to the invention.

The circuitry according to the invention which will be discussed in detail below operates in a substantially different manner, namely by responding to the leading half-wave portion of the input signal. If necessary, the input signal may be inverted as illustrated in FIG. 2 so as to present a positive pulse as the initial half-wave. In this illustration, the threshold value is shown as a value 15 or 17, referring, respectively, to input signals 11 of high frequency and input signals 12 of low frequency. As in the prior art, when the input signal reaches the threshold, the switching stage of the circuit responds by generating an output pulse, labeled 14 and 18, respectively. It will be seen that the leading edges of these pulses are substantially shifted with respect to one another and hence with respect to the zero crossing point $t_0$. However, it is a feature of the present invention to so terminate the output pulses 14 and 18 that their trailing edges exactly coincide with the zero crossing point 13, irrespective of the shape and frequency of the input signal. Accordingly, the trailing edge of the pulses may be used for the exact determination of the angular position of the rotating shaft, thereby making possible a precise measurement which is unaffected by external factors and can be used for single pin or multipin transducers. A particular advantage of this apparatus is that the threshold value may be chosen to be relatively high.

Figure 3:
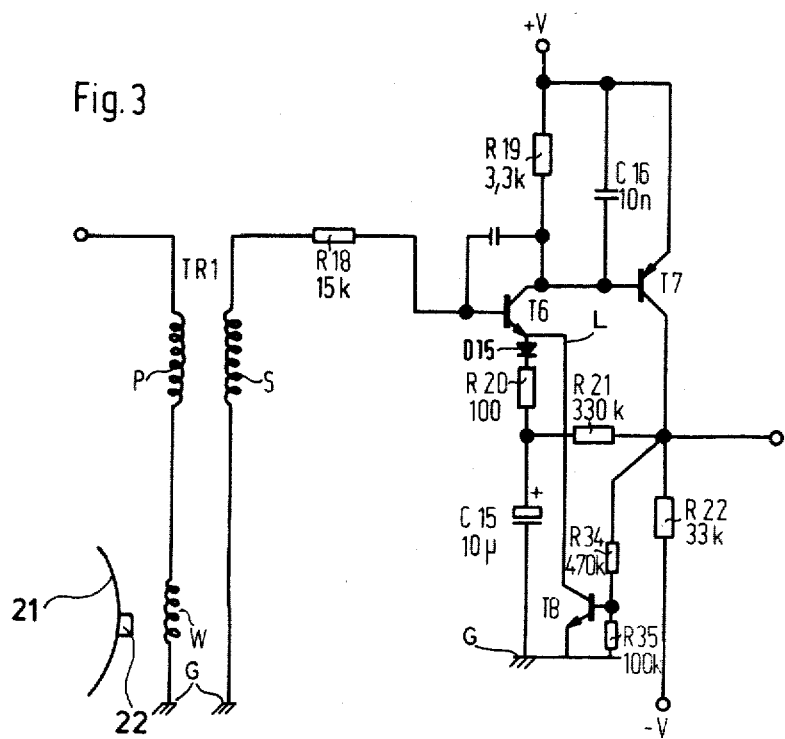
FIG. 3 is a detailed circuit diagram of an embodiment of the invention.

The exemplary embodiment of the invention is shown in detail in FIG. 3. It includes a sensing coil W in which input pulses are generated by the passage of a pin 22 attached to some part of the rotating shaft 21. The sensing coil W is connected in series with the primary windings of a transformer TR1 whose secondary windings are connected between ground and the base of an NPN transistor T6 via an input resistor R18. The collector of the transistor T6 is connected through a resistor R19 to a source of positive voltage, for example 12 V, and its emitter is connected through a diode D15, a resistor 20 and a capacitor C15 to circuit ground. The collector of the transistor T6 is further connected to the base of a complementary PNP transistor T7 whose emitter is connected to the positive supply voltage and whose collector is connected through a resistor R22 to a source of negative supply voltage. The collector of T7 is further connected through a resistor R21 to the junction of the capacitor C15 and the resistor R20. A voltage divider consisting of resistors R34 and R35 is connected between the collector of T7 and ground. The junction of resistors R34 and R35 is connected to the base of a third transistor NPN T8. The emitter of transistor T8 is grounded. Its collector connected by connection L to the emitter of the first transistor T6.

Operation: When the circuit is in its quiescent stage, i.e., when no input signal is present, the base of the first transistor T6 is grounded. This transistor remains conducting because its emitter is connected through the series resistors R22, R21 and R20 and through the diode D15 to a source of negative voltage although the current passing through the transistor T6 is very small due to the high value of the resistor R21. This small current generates only a small voltage drop on the collector resistor R19 which does not suffice to render the complementary transistor T7 conducting. Accordingly, the output signal at the collector of T7 is at a negative value determined by the ratio of the resistors R21 and R22. This negative voltage holds the transistor T8 in the non-conducting condition. The capacitor C15 is charged to the emitter voltage of the transistor T6, i.e., substantially to ground. When the pin 22 approaches and passes the sensing coil W of the transducer, it induces therein a voltage pulse which is illustrated schematically by the curves 1 and 2 of FIG. 1 or 11 and 12 of FIG. 2. The relative connections of the transformer coils are such that the initial half-wave of the pulse is a positive-going signal. This positive-going half-wave substantially increases the base-emitter potential of the transistor T6 which thereby is able to conduct a stronger current that flows into the capacitor via the diode D15 and the very low-valued resistor R20. This increased current lowers the collector voltage of the switching transistor T6, permitting the amplifier transistor T7 to conduct. The current through the transistor T7 is limited by the resistor R22 but increases the collector voltage to a positive value which is transmitted to the base of the transistor T8. Transistors T8 becomes conducting and thus places through line L. The emitter of the transistor T6 at ground potential at ground bus G. Discharge of the capacitor C15 through the transistor 8 is prevented by the diode 15. The ground potential now present at the emitter of the transistor T6 represents a new threshold value of the switching stage. The switching transistor T6, and hence also the amplifier transistor T7, remain conducting until the input voltage at the base of the transistor T6 reaches zero and assumes negative values. At the point of zero crossing, the transistor T6 is blocked, thereby placing its collector potential at positive values which then blocks the transistor T7 so that the output signal of the collector of T7 again becomes negative. This event terminates the occurrence of the output pulse at the time $t_0$. At the same time, the base voltage of the transistor T8 again becomes negative, causing the transistor to block so that the emitter of the transistor T6 is uncoupled from ground potential. As a consequence, the voltage across the capacitor C15 becomes dominant and defines an increased threshold which is exceeded by the next positive-going half-wave of the subsequent input signal, thereby repeating the above-described process.

In summary, it is to be noted that the trigger pulse amplifier according to the invention prepares the circuit upon the passage of a portion of the first half-wave of the signal, prior to the occurrence of the zero crossing point. Subsequently, when the signal crosses the value 0, the circuit generates a unique and well-defined feature of its output signal, namely the trailing edge of the output signal. In this manner, the output signal contains a trigger feature which is unaffected by the shape or frequency of the input signal. As already noted, the invention is not limited to the application to transducers in which the first half-wave of the signal is positive because it is readily possible to embody the circuit with complementary components which respond to a negative-going half-wave. Furthermore, the trailing edge of the output signal can be adapted for subsequent processing by the inclusion of logical inverters.

Various changes and modifications may be made in the invention and other variants and embodiments are possible within the inventive concept.

We claim:

1. Pulse amplifier particularly for connection to an inductive sensor to generate an output signal having a pulse flank timing which has a fixed relationship with respect to substantially sinusoidal signals of varying amplitude and frequency, in which the substantially sinusoidal signals have half-waves changing polarity at a zero crossing point, said circuit generating an output pulse signal whose trailing edge coincides with the zero crossing point of the signal applied thereto, comprising a threshold switch (T6) for receiving the substantially sinusoidal signal;

an amplifier stage (T7) connected to said threshold switch and delivering an output signal when the threshold level of the threshold switch is passed;

means (C15) connected to the threshold switch (T6) establishing a first threshold level, which first threshold level is less than the amplitude of the input signal;

a switch element (T8) coupled to the output of the amplifier stage (T7), said threshold switch, upon passing of the amplitude of the substantially sinusoidal signal supplied thereto beyond the threshold level, changing state and hence causing the amplifier stage to deliver an output signal to the switch element (T8) to cause the switch element to change state;

coupling circuit means (L) coupling the switch element (T8) to the threshold switch and establishing a second threshold level thereat which corresponds at least approximately to zero or no voltage of the signal supplied thereto and hence to the zero crossover thereover due to the switch element being in said changed state consequent to the output signal furnished by the amplifier stage;

a source of a reference potential (G) connected to said switch element (T8) for direct connection to said threshold switch; p2 wherein said threshold switch includes a capacitor (C15) which, when charged, establishes said first threshold level; and a coupling diode (D15) connected to said capacitor and isolating the charge on the capacitor from said coupling circuit means (L) and hence the switch element (T8) to prevent interference between said first and second threshold levels when the switch element has changed state and applies the second threshold level to the threshold switch.

2. Amplifier according to claim 1, wherein said amplifier stage includes a second transistor (T7) whose base is connected to the collector of said first transistor (T6), and whose polarity is complementary to that of the first transistor (T6); and whose collector generates an output signal and is connected to said switch element (T8) to control the switching state thereof.

3. Amplifier according to claim 2, wherein said switch element is a third transistor (T8) of the same polarity as said first transistor (T6), the coupling circuit means (L) being a direct connection of the collector of said third transistor (T8) to the emitter of the first transistor (T6) and the emitter of the transistor (T8) being connected directly to said reference potential (G), the base of the third transistor (T8) is connected to the junction of a voltage divider (R34,R35) connected between the collector of the second transistor (T7) and said source of reference potential (G).

4. Amplifier according to claim 1, wherein said threshold switch includes a first transistor (T6) whose emitter is connected (a) via said diode (D15) to said capacitor (C15), and
(b) via said coupling circuit means to said switch element; and wherein the base of said first transistor (T6) receives said input signals; and its collector is connected to a source of potential.

5. Pulse amplifier particularly for connection to an inductive sensor to generate an output signal having a pulse flank timing which has a fixed relationship with respect to substantially sinusoidal signals of varying amplitude and frequency, in which the substantially sinusoidal signals have half-waves changing polarity at a zero crossing point, said circuit generating an output pulse signal whose trailing edge coincides with the zero crossing point of the signal applied thereto.

comprising a threshold switch (T6) for receiving the substantially sinusoidal signal;

an amplifier stage (T7) connected to said threshold switch and delivering an output signal when the threshold level of the threshold switch is passed;

means (C15) connected to the threshold switch (T6) establishing a first threshold level, which first threshold level is less than the amplitude of the input signal;

a switch element (T8) coupled to the output of the amplifier stage (T7), said threshold switch, upon passing of the amplitude of the substantially sinusoidal signal supplied thereto beyond the threshold level, changing state and hence causing the amplifier stage to deliver an output signal to the switch element (T8) to cause the switch element to change state;

coupling circuit means (L) coupling the switch element (T8) to the threshold switch and establishing a second threshold level thereat which corresponds at least approximately to zero or no voltage of the signal supplied thereto and hence to the zero crossover thereover due to the switch element being in said changed state consequent to the output signal furnished by the amplifier stage;

wherein said threshold switch comprises a first transistor (T6);

said switch element comprises a switching transistor (T8) connected to and controlled by the state of said amplifier stage (T7), a source of reference potential (G) is provided connected to said switching transistor (T8); and decoupling means (D15) is provided decoupling said first threshold level establishing means (C15) with respect to said coupling circuit means (L) to permit, selectively, application of the first threshold level to the first transistor (T6) or the level of said reference potential (G) to said first transistor (T6) when said switching transistor (T8) is in a switching state which applies the reference potential (G) through the coupling circuit means (L) to the first transistor.

6. Amplifier according to claim 5, wherein said first threshold level establishing means (C15) comprises a capacitor (C15) which is charged through said first transistor upon conduction thereof from a source of voltage (+V).

* * * * *